United States Patent [19]

Igawa et al.

[11] Patent Number: 5,541,036
[45] Date of Patent: Jul. 30, 1996

[54] NEGATIVE PHOTORESIST COMPOSITIONS COMPRISING A PHOTOSENSITIVE COMPOUND, AN ALKOXYMETHYLATED MELAMINE AND NOVOLAK RESIN

[75] Inventors: Akihiko Igawa, Kakegawa; Masato Nishikawa, Haibara-gun, both of Japan; Georg Pawlowski, Wiesbaden, Germany; Ralph Dammel, Coventry, R.I.

[73] Assignee: Hoechst Japan Limited, Tokyo, Japan

[21] Appl. No.: 46,728

[22] Filed: Apr. 16, 1993

[30] Foreign Application Priority Data

Apr. 28, 1992 [JP] Japan .................................. 4-110285

[51] Int. Cl.$^6$ ........................................... G03C 1/73
[52] U.S. Cl. ......................... 430/270.1; 430/325; 522/63; 522/166
[58] Field of Search ............................. 430/270, 325; 522/166, 63

[56] References Cited

U.S. PATENT DOCUMENTS

| | | | |
|---|---|---|---|
| 4,581,321 | 4/1986 | Stahlhofen | 430/325 |
| 4,619,998 | 10/1986 | Buhr | 544/193.1 |
| 4,847,314 | 7/1989 | Tortorello et al. | 524/317 |
| 5,034,304 | 7/1991 | Feely | 430/270 |
| 5,128,232 | 7/1992 | Thackeray et al. | 430/270 |
| 5,196,481 | 3/1993 | Owens et al. | 525/108 |

OTHER PUBLICATIONS

*Polymer Science Dictionary*, Mark Alger, pp. 255–256.

*Primary Examiner*—Christopher D. Rodee
*Assistant Examiner*—Laura Weiner
*Attorney, Agent, or Firm*—Foley & Lardner

[57] ABSTRACT

A negative photoresist composition comprising:

(A) a compound represented by the following formula (I):

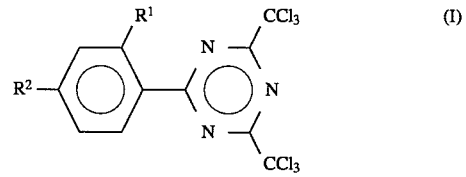

wherein $R^1$ and $R^2$ which are different from each other represent a hydrogen atom or a group represented by the following formula (II):

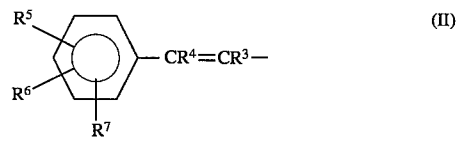

(B) an alkoxymethylated melamine, and
(C) a novolak resin.

The photoresist composition has resolution below submicron, and can form resist patterns with an ideal rectangular profile.

12 Claims, No Drawings

NEGATIVE PHOTORESIST COMPOSITIONS COMPRISING A PHOTOSENSITIVE COMPOUND, AN ALKOXYMETHYLATED MELAMINE AND NOVOLAK RESIN

BACKGROUND OF THE INVENTION

1. Field of the Invention

The present invention relates to photosensitive resin compositions, and more specifically to negative photoresist compositions which are used for the production of semiconductors such as an integrated circuit (IC) and a large-scale integration (LSI), and a liquid crystal display (LCD).

2. Related Art

As a photoresist for producing semiconductor devices such as ICs and LSIs, at the beginning, a cyclized rubber photoresist obtained by dissolving a cyclized rubber and a photosensitive bisazide in an organic solvent was used. Irradiation with light to the cyclized rubber photoresist generates nitrene which brings about the cleavage of double bonds in the cyclized rubber to cause polymerization, thereby producing a crosslinked network polymer. With the improvement in the integration of integrated circuits, a line & space width in a resist pattern which is formed by a photoresist has been made narrower year after year. (The term "line & space width" herein is intended to refer to the width of two lines of those formed in a resist pattern at regular intervals. A resist which can reproduce patterns with a narrower line & space width is a resist capable of forming finer patterns.) Under such circumstances, the above-described cyclized rubber photoresist cannot meet the present demand for finer resist patterns any more because the rubber swells in a solution.

A positive resist prepared by the combination use of a novolak resin which does not swell in a solution at all and a naphthoquinone diazide has then been used. Furthermore, not only the materials for photoresists but light to be used for exposure has been studied in order to obtain finer patterns, and, as a result, light having a wavelength of 365 nm, called i-line, has been substituted for light having a wavelength of 436 nm, called g-line. Those photosensitive naphthoquinone diazides which can effectively act in light having such a wavelength have also been studied and selected.

However, even when the use of such a positive resist consisting of the novolak resin and the naphthoquinone azide and exposure to i-line are adopted in combination, the line & space width of a mass-produced pattern is limited to 0.5 μm, that is, a so-called submicron level is the limit on a mass production scale.

In order to obtain resolution below submicron, a phase-shifting method in which a layer called a shifter is partially provided on a photomask and a phase is shifted to obtain improved resolution is now being studied. A conventional i-line exposure apparatus can be employed in this method as it is. However, a negative photoresist is suitable as a photoresist for this method, so that the development of negative photoresists is highly expected.

LCDs are also produced by using a photoresist in the same manner as in the production of semiconductors. When a positive photoresist is used as the photoresist in the production of LCDs, the resist remains at the periphery of a panel. This is not very favorable because the resist remaining at the periphery tends to fall off during the production of the panel, resulting in decrease in the production yield of the panel. For this reason, a negative photoresist which does not remain at the periphery of a panel during the production thereof is desirable for the production of LCDs. The development of suitable negative photoresists is therefore expected.

Some negative photoresists applicable to the above-described phase-shifting method for producing semiconductors or to the production of LCDs have been proposed. However, these photoresists have shortcomings in that they require a developing process using an organic solvent, and that an extremely long exposure time is required since their photosensitivity is too low. Furthermore, it is desirable that the profile of the developed photoresist be rectangular. It is, however, difficult to obtain an ideal rectangular profile by using the conventional photoresists. In some cases, whisker-like raised portions are formed in those areas from which the resist should be removed completely.

SUMMARY OF THE INVENTION

An object of the present invention is to provide negative photoresists having various properties which are generally expected to negative photoresists.

Another object of the present invention is to provide negative photoresists which have resolution below submicron and, at the same time, can form resist patterns with an ideal rectangular profile.

A negative photoresist composition according to the present invention comprises:

(A) a compound represented by the general formula (I):

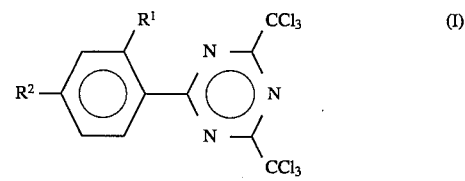

wherein $R^1$ and $R^2$, which are different from each other represent a hydrogen atom or a group represented by the following formula (II):

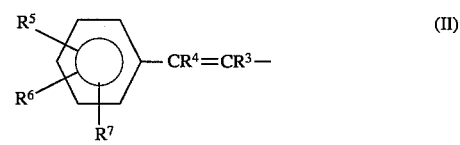

wherein $R^3$ and $R^4$, which may be the same or different from, each independently represent a hydrogen atom or an alkyl group, and $R^5$, $R^6$ and $R^7$, which may be the same or different from one another, represent a hydrogen atom, a halogen atom, a substituted or unsubstituted alkyl group in which one or more methylene groups contained in the alkyl chain may be substituted by an oxygen atom or a sulfur atom, a cycloalkyl group, an alkenyl group, an aryl group or an aryloxy group, or two alkyl groups represented by $R^5$, $R^6$ or $R^7$ may form a 5- or 6-membered ring, (B) an alkoxymethylated melamine, and (C) a novolak resin.

By using the negative photoresist according to the present invention, patterns with a line & space width of below the so-called sub-half-micron level, i.e., less than 0.5 μm, can be formed on a substrate. In a preferred embodiment of the present invention, patterns with a line & space width of approximately 0.3 μm can be formed. In addition, patterns with an ideal rectangular profile can be formed on a substrate by using the negative photoresist according to the present invention. Furthermore, unexposed areas of the photoresist layer are completely removed by an alkaline solution, so that whisker-like raised portions are not formed in those areas from which the resist should be completely removed. It was unexpected that such excellent properties of the photoresist composition can be attained by the combination use of a specific photosensitive compound and a resin.

DETAILED DESCRIPTION OF THE INVENTION

The negative photoresist composition according to the present invention comprises a compound represented by the general formula (I), a novolak resin and melamine.

Compound of Formula (X)

In the general formula (I) representing the compound which is a constituent of the composition according to the present invention, one of $R^1$ and $R^3$ represents a hydrogen atom, and the other represents a group having the general formula (II).

In the general formula (II), $R^3$ and $R^4$, which may be the same or different, each independently represent a hydrogen atom or a straight or branched alkyl group, preferably a hydrogen or a $C_{1-4}$ alkyl group, and more preferably a hydrogen atom.

A halogen atom represented by $R^5$, $R^6$ or $R^7$ is preferably fluorine, chlorine or bromine, more preferably fluorine or chlorine.

$R^5$, $R^6$ and $R^7$ may be the same or different from one another, and represent a straight or branched alkyl group, a cycloalkyl group, a straight or branched alkenyl group, an aryl group such as phenyl, tolyl, xylyl or naphthyl, or an aryloxy group such as phenyloxy, tolyloxy, xylyloxy or naphthyloxy. It is preferable that the total number of carbon atoms contained in $R^5$, $R^6$ and $R^7$ be 12 or less at maximum.

One or more hydrogen atoms contained in an alkyl group represented by $R^5$, $R^6$ or $R^7$ may be substituted. Preferable substituents include halogen (preferably fluorine, chlorine or bromine, more preferably chlorine or bromine), an aryl group and an aryloxy group.

One or more methylene groups contained in the chain of an alkyl group represented by $R^5$, $R^6$ or $R^7$ may be substituted by an oxygen atom or a sulfur atom. Namely, among methylene groups contained in the alkyl group, a methylene group which is directly bound to a phenyl group becomes an alkoxy group or an alkylthio group when substituted by an oxygen atom or a sulfur atom, and a methylene group which is contained in the chain of the alkyl group becomes an alkoxyalkyl group or an alkylthioalkyl group when substituted by an oxygen atom or a sulfur atom. Therefore, in the present invention, the term "alkyl group" represented by $R^5$, $R^6$ or $R^7$ is intended to include an alkoxy group, an alkylthio group, an alkoxyalkyl group and an alkylthioalkyl group.

Furthermore, two alkyl groups represented by $R^5$, $R^6$ or $R^7$ may form a 5- or 6-membered ring. Specific examples of such a ring include a dioxymethylene group bound to the 2- and 3-positions, or to the 3- and 4-positions of the benzene ring in the general formula (II), and an a-naphthyl or β-naphthyl group formed with the benzene ring to which $R^5$, $R^6$ and $R^7$ are bound.

In the composition according to the present invention, preferred examples of substituted or unsubstituted phenyl in the general formula (II) contained in the compound having the general formula (I) include phenyl; 2-, 3- or 4-fluorophenyl; 2-, 3- or 4-chlorophenyl; 2-, 3- or 4-bromophenyl; 2-, 3- or 4-methyl-, ethyl-, propyl-, butyl-, isobutyl-, hexyl-, nonyl- or dodecylphenyl; 2-, 3- or 4-methoxy-, ethoxy-, isopropoxy-, butoxy-, pentoxy-, octyloxy- or decyloxyphenyl; 2,4-dichloro- or dibromophenyl; 3,4-dichloro- or dibromophenyl; 2,6-dichlorophenyl; 3-bromo-4-fluorophenyl; 2,3-, 2,4-, 2,5-, 3,4- or 3,5-dimethoxy-, diethoxy-, dibutoxy- or dihexoyphenyl; 2-ethoxy-5-methoxyphenyl; 3-chloro-4-methylphenyl; 2,4-dimethylphenyl; 2-, 3- or 4-methoxyethyl-, ethoxyethyl-, butoxyethylphenyl; 2,4,6-trimethylphenyl; 3,4,5-trimethoxy- or triethoxyphenyl; or 2,3- or 3,4-dioxymethylenephenyl.

Examples of the compound represented by the general formula (I) which is considered to be more preferably used in the composition according to the present invention include those compounds in which $R^1$ or $R^2$ is a group having the general formula (II) wherein $R^3$, $R^4$, $R^5$, $R^6$ and $R^7$ represent a hydrogen atom, or $R^3$, $R^4$, $R^5$ and $R^6$ represent a hydrogen atom and $R^7$ represents a chlorine atom at the 2-position.

The compound of the general formula (I) can be prepared, for example, by the method described in U.S. Pat. No. 4,619,998 or any one of other methods similar to it.

Alkoxymethylated Melamine

The alkoxymethylated melamine, a constituent of the composition according to the present invention, has such a structure that hydrogen atoms of amino groups contained in melamine are entirely or partially, preferably entirely, substituted by an alkoxymethyl group, preferably a $C_{1-10}$ alkoxymethyl group, more preferably a $C_{1-4}$ alkoxymethyl group. Although no particular limitation is imposed on the degree of this alkoxymethylation, it is preferably 30% or more, more preferably 70% or more. It is also possible that melamine be alkoxymethylated with two or more alkoxymethyls having carbon atoms in different numbers.

The alkoxymethylated melamine can be usually obtained by a reaction between melamine and an aldehyde under acidic condition. By this reaction, lower polymers having a polymerization degree of 2 to 5 are also produced together with monomers. In the composition according to the present invention, the monomer ratio of the alkoxymethylated melamine is preferably 60% or more, more preferably 80% or more.

Preferred examples of the alkoxymethylated melamine include methoxymethylated melamine, ethoxymethylated melamine, propoxymethylated melamine and butoxymethylated melamine. Commercially available alkoxymethylated melamines can also be utilized, and examples of such melamines are as follows: "Cymel (Registered Trademark) 300" (manufactured by Mitsui-Cyanamid, Ltd., methoxymethylated melamine., monomer ratio: 85%), "Cymel 303" (manufactured by Mitsui-Cyanamid, Ltd., methoxymethylated melamine, monomer ratio: 80%), "Nikalac MW-30HM" (manufactured by Sanwa Chemical Co., Ltd., methoxymethylated melamine, monomer ratio 95%) and "Nikalac MW-40" (manufactured by Sanwa Chemical Co., Ltd., a mixture of methoxy- and butoxymethylated melamines).

The above melamines can be used for preparing the composition according to the present invention either singly or in combination of two or more.

Novolak Resin

A compound obtained by condensation between m-cresol and an aldehyde (e.g. formaldehyde) can be used as the novolak resin which is a constituent of the composition according to the present invention. According to a preferred embodiment of the present invention, it is preferable to use a novolak resin obtained by condensation between a mixture containing m-cresol and one or more phenols selected from the group consisting of p-cresol, 2,4-xylenol, 2,5-xylenol and 3,5-xylenol, and an aldehyde.

In the case where the mixture of m-cresol and the phenols is used, it is preferable to utilize a mixture containing from 85% to 35% by weight, more preferably from 75% to 45% by weight of m-cresol, and preferably from 15% to 65% by weight, more preferably from 25% to 55% by weight of one or more phenols selected from the group consisting of p-cresol, 2,4-xylenol, 2,5-xylenol and 3,5-xylenol. It is more preferable to utilize a mixture containing from 75% to 45% by weight of m-cresol, from 45% to 15% by weight of p-cresol, from 8% to 2% by weight of 2,4-xylenol and from 18% to 12% by weight of 2,5-xylenol; or a mixture containing from 75% to 45% by weight of m-cresol and from 25% to 55% by weight of 3,5-xylenol.

In the composition according to the present invention, when the phenols are used together with m-cresol in the aforementioned proportion, the resulting resist can have a hard surface and, as a result, can give an improved film-remaining ratio. In addition, it can form a pattern with a sharp profile having no round edges.

The weight-average molecular weight of the above novolak resin, calculated in terms of polystyrene, is controlled within the range of 2,000 to 100,000, preferably 2,000 to 50,000, more preferably 3,000 to 20,000. When the molecular weight of the resin is less than 2,000, it is hard to obtain a sufficient crosslink density. As a result, the film-remaining ratio is drastically lowered, and, in the worst case, all of the images of the resist run. On the other hand, when the molecular weight of the resin is in excess of 100,000, the crosslink density becomes too high. As a result, crosslinking is readily caused even by heat, so that those portions which should be dissolved by an alkaline developing solution are remained, not dissolved.

Condensation between m-cresol or the mixture of m-cresol and the above-described phenols, and an aldehyde can be carried out by a conventional method, for instance, by heating desired phenols and an acid catalyst (e.g. oxalic acid) placed in a reaction vessel, adding an aldehyde dropwise into the mixture while stirring, and further heating the resulting mixture.

Negative Photoresist Composition

It is preferable that the negative photoresist composition according to the present invention comprises the compound having the general formula (I), the alkoxymethylated melamine and the novolak resin in such a proportion as to fulfill the following relationship.

The amount of the compound having the general formula (I) is such that the weight ratio of the compound of formula (I) to the melamine is preferably in the range of 1/30 or more and 1/3 or less, more preferably 1/20 or more and 1/5 or less. In the case where the weight ratio of the compound of formula (I) to the melamine is less than the above range, it may be that a relatively large quantity of exposure energy is required, and that the minimum line & space width also becomes large. On the other hand, when the amount of the compound of formula (I) is in excess of the above range, the crosslinking reaction speed may become too fast, and the sensitivity becomes so high that it cannot be well controlled even by a stepper, which is a most accurate exposure apparatus among commercially available ones.

It is also preferable that the total amount of the compound of formula (I) and the melamine be selected so that the weight ratio of the compound of formula (I) and the melamine to the novolak resin will be within the range of 1/20 or more and 1/2 or less, more preferably 1/10 or more and 1/3 or less. In the case where the total amount of the compound of formula (I) and the melamine to the novolak resin is less than the above range, the film-remaining ratio can be less than 90%; on the other hand, when it is in excess of the above range, the profile of the resist pattern can be non-rectangular (a reverse tapered shape whose upper portion is wider and lower portion is narrower).

According to a preferred embodiment of the present invention, it is recommended to make the amount of the compound of formula (I) large when the molecular weight of the novolak resin is small, and to make the amount of the compound of formula (I) small when the molecular weight of the novolak resin is large. The relationship between the molecular weight of the novolak resin and the amount of the compound (I), which is considered to be the most preferred, is as shown in below Table 1.

TABLE 1

| Weight-Average Molecular Weight of Novolak Resin | Compound (I) (weight)/ Novolak Resin (weight) |
| --- | --- |
| 3,000 | 1/16 |
| 5,000 | 1/44 |
| 10,000 | 1/84 |
| 20,000 | 1/124 |

The negative photoresist composition according to the present invention is prepared by dissolving the above-described components in an organic solvent. Any organic solvent can be used for this purpose as long as the aforementioned components can be dissolved in it and the resulting resist can be successfully used as a photoresist. Specific examples of the preferred organic solvent include glycol ethers such as ethylene glycol monomethyl ether, ethylene glycol monoethyl ether and propylene glycol monomethyl ether; glycol ether acetates such as ethylene glycol monoethyl ether acetate and propylene glycol monomethyl ether acetate; esters such as ethyl acetate, butyl acetate and ethyl lactate; ketones such as acetone, methyl ethyl ketone, cyclopentanone and cyclohexanone; and aromatic hydrocarbons such as toluene and xylene. In addition, acetonitrile, dimethylformamide, dioxane and the like can also be used. These solvents can be used either singly or as a mixture of two or more.

In general, the negative photoresist composition according to the present invention is prepared by adding the above-described components to the above solvent(s), where the total amount of the components is approximately 10% to 40% by weight, preferably 15% to 30% by weight of the solution.

A third component can be added to the negative photoresist composition according to the present invention within such a range that it does not mar the effects of the composition. Examples of such a third component include a surface active agent by which radial striation that appears when a substrate is coated with a photoresist can be prevented, a dye by which reflection from a substrate can be decreased, an ultraviolet absorbing agent by which exposure light can be absorbed moderately, a sensitizer by which sensitivity is enhanced, an adhesion-increasing agent by which adhesion to a substrate can be increased, and an anti-foam agent by which foaming can be suppressed.

A method for forming a fine pattern by using the negative photoresist composition thus obtained will be explained. Onto the surface of a substrate on which a fine pattern is intended to be formed, the photoresist according to the present invention is coated by means of spin coating or roller coating so that the resist layer will have a uniform thickness (preferably about 0.5 to 3.0 μm, more preferably about 1.0 to 2.0 μm), and then dried on a hot plate or in a convection oven with internal air circulation. Subsequently, the substrate on which the photoresist layer is formed is covered with a mask having a desired pattern, followed by irradiation of light having a wave length of 200 to 500 nm, preferably g-line or i-line. The composition of the present invention is soluble in an alkaline solution if it is not treated. However, it becomes insoluble in an alkaline solution after it is exposed to light. Therefore, when unexposed areas of the photoresist layer are removed by an alkaline solution after the exposure, a pattern which is reverse to the pattern formed on the mask can be formed, that is, developed on the substrate. The substrate thus obtained is then supplied to the further process of producing an IC or an LSI. By repeating the above procedure, a final product such as an IC or an LSI can be produced.

A 0.3–3% aqueous solution of an inorganic alkali such as NaOH or KOH, or a 2–4% aqueous solution of an organic alkali such as tetramethyl ammonium hydroxide can be favorably used as the alkaline solution used for alkaline development.

Experimental

The negative photoresist composition according to the present invention will now be explained more specifically referring to Examples. However, the following examples should not be construed as limiting the present invention.

It is noted that the compounds (1), (2) and (3) used in the following examples as the compounds represented by the general formula (I) are as follows:

Compound (1): In the general formula (I), $R^1$ represents a hydrogen atom, and $R^2$ represents a group having the general formula (II) wherein all of $R^3$, $R^4$, $R^5$, $R^6$ and $R^7$ represent a hydrogen atom;

Compound (2): In the general formula (I), $R^2$ represents a hydrogen atom, and $R^1$ represents a group having the general formula (II) wherein all of $R^3$, $R^4$, $R^5$, $R^6$ and $R^7$ represent a hydrogen atom; and Compound (3): In the general formula (I), $R^1$ represents a hydrogen atom, and $R^2$ represents a group having the general formula (II) wherein $R^3$, $R^4$, $R^5$ and $R^6$ represent a hydrogen atom and $R^7$ represents a chlorine atom at the 2-position.

EXAMPLE 1

3,5-Xylenol and m-cresol were charged in the weight ratio of 3:7, and condensation-polymerized with formaldehyde in a conventional manner, thereby obtaining a novolak resin having a weight-average molecular weight (calculated in terms of polystyrene) of 5,000 and a glass transition temperature of 105° C. The compound (1) and hexamethoxy methyl melamine ("Cymel (Trademark) 300" manufactured by Mitsui-Cyanamid, Ltd.) were also prepared.

The above-obtained novolak resin, the compound (1) and the hexamethylol melamine were dissolved in a solvent, polypropylene glycol monoethyl ether acetate, whereby a photoresist composition was obtained. In this process, the components were charged so that the weight ratio of the compound (1) to the hexamethoxy methyl melamine would be ⅒, and the weight ratio of the total of the compound (1) and the hexamethylol melamine to the novolak resin would be ¼.

The photoresist composition thus obtained was coated onto a silicon wafer by means of spin coating, and then dried on a hot plate at a temperature of 90° C. Thus, a resist layer with a thickness of 1.0 μm was provided on the silicon wafer.

This silicon wafer was exposed by using an i-line stepper NSR 1755i7A (manufactured by Nikon Corp.) through a mask, and baked on a hot plate at a temperature of 100° C. The wafer was then developed by a 2.38% aqueous solution of tetramethyl ammonium hydroxide. As a result, a pattern which was reverse to the pattern formed on the mask used was formed on the wafer by the resist. By the electron-microscopic observation of this resist pattern, it was found that the pattern was resolved to the line & space width of 0.3 μm, that the profile of the resist was ideally rectangular, and that no whisker-like raised portions or the like were observed. The exposure energy required to resolve the line width and the space width of the resist to 1:1 was 70 mJ/cm2, and the film-remaining ratio at this exposure energy was 97%. The profile of the smallest resist line resolved was observed by an electron microscope, and the rectangular degree of the profile of the resist was evaluated by the ratio (b/a) of the length of the lowermost part (a) of the profile to that of the uppermost part (b). As a result, this value was 1.0, and the profile of the resist line was thus found to have an ideal rectangular shape.

EXAMPLES 2 TO 13

The procedure of Example 1 was repeated except that the components shown in below Table 2 were used in place of the components used in Example 1, whereby negative photoresist compositions were obtained.

By using the above negative photoresist composition, a resist pattern was formed on a silicon wafer in the same manner as in Example 1. The minimum line & space width of this resist pattern, the exposure energy which was required to resolve the line width and the space width of the resist to 1:1, the film-remaining ratio at this exposure energy, and the profile of the resist (b/a) are as shown in Table 2.

EXAMPLE 14 m-Cresol and formaldehyde were condensation-polymerized in a conventional manner, thereby obtaining a novolak resin having a weight-average molecular weight (calculated in terms of polystyrene) of 3.000. The procedure of Example 6 was repeated except that the above-obtained novolak resin was used in place of the novolak resin used in Example 6, thereby obtaining a negative photoresist composition.

By using this negative photoresist composition, a resist pattern was formed on a silicon wafer in the same manner as in Example 6. The minimum line & space width of this resist pattern, the exposure energy which was required to resolve the line width and the space width of the resist to 1:1, the film-remaining ratio at this exposure energy, and the profile of the resist (b/a) are as shown in Table 2.

EXAMPLE 15 m-Cresol, p-cresol, 2,4-xylenol and 2,5-xylenol were charged in the weight ratio of 50:30:5:15, and condensation-polymerized with formaldehyde in a conventional manner, thereby obtaining a novolak resin having a weight-average molecular weight (calculated in terms of polystyrene) of 10,000. The procedure of Example 2 was repeated except that the novolak resin thus obtained was used in place of the novolak resin used in Example 2, whereby a negative photoresist composition was obtained.

By using this negative photoresist composition, a resist pattern was formed on a silicon wafer in the same manner as in Example 1. The minimum line & space width of this resist pattern, the exposure energy which was required to resolve the line width and the space width of the resist to 1:1, the film-remaining ratio at this exposure energy, and the profile of the resist (b/a) are as shown in Table 2.

EXAMPLE 16

The procedure of Example 1 was repeated except that the compound (2) was used in place of the compound (1), whereby a negative photoresist composition was obtained.

By using this negative photoresist composition, a resist pattern was formed on a silicon wafer in the same manner as in Example 1. The minimum line & space width of this resist pattern, the exposure energy which was required to resolve the line width and the space width of the resist to 1:1, the film-remaining ratio at this exposure energy, and the profile of the resist (b/a) are as shown in Table 2.

EXAMPLE 17

The procedure of Example 1 was repeated except that the compound (3) was used in place of the compound (1), whereby a negative photoresist composition was obtained.

By using this negative photoresist composition, a resist pattern was formed on a silicon wafer in the same manner as in Example 1. The minimum line & space width of this resist pattern, the exposure energy which was required to resolve the line width and the space width of the resist to 1:1, the film-remaining ratio at this exposure energy, and the profile of the resist (b/a) are as shown in Table 2.

TABLE 2

| Example | (A)/(B) | (A) + (B) / (C) | Line & Space Width (μm) | Exposure Energy (mJ/cm$^2$) | Film-Remaining Ratio (%) | Resist Profile (b/a) |
|---|---|---|---|---|---|---|
| 1 | 1/10 | 1/4 | 0.35 | 70 | 97 | 1.0 |
| 2 | 1/20 | 1/4 | 0.35 | 83 | 97 | 1.0 |
| 3 | 1/30 | 1/4 | 0.40 | 95 | 96 | 1.0 |
| 4 | 1/40 | 1/4 | 0.45 | 110 | 96 | 1.1 |
| 5 | 1/5 | 1/4 | 0.30 | 62 | 97 | 1.0 |
| 6 | 1/3 | 1/4 | 0.32 | 54 | 97 | 1.0 |
| 7 | 1/2 | 1/4 | 0.35 | 20 | 97 | 1.1 |
| 8 | 1/10 | 1/10 | 0.30 | 82 | 96 | 1.0 |
| 9 | 1/10 | 1/20 | 0.32 | 105 | 90 | 1.0 |
| 10 | 1/10 | 1/30 | 0.35 | 120 | 85 | 1.1 |
| 11 | 1/10 | 1/3 | 0.32 | 65 | 97 | 1.1 |
| 12 | 1/10 | 1/2 | 0.35 | 62 | 96 | 1.2 |
| 13 | 1/10 | 1/1.5 | 0.35 | 56 | 96 | 1.3 |
| 14 | 1/3 | 1/4 | 0.30 | 80 | 95 | 1.0 |
| 15 | 1/20 | 1/4 | 0.30 | 75 | 97 | 1.0 |
| 16 | 1/10 | 1/4 | 0.30 | 63 | 97 | 1.0 |
| 17 | 1/10 | 1/4 | 0.30 | 72 | 97 | 1.0 |

In the table, the symbols (A), (B) and (C) refer to the weight of the compound of formula (I), the weight of the alkoxymethylated melamine, and the weight of the novolak resin, respectively.

COMPARATIVE EXAMPLE 1

The procedure of Example 1 was repeated except that 2-(p-methoxyphenyl)-4,6-bis(trichloromethyl)-1,3,5-triazine was used in place of the compound (1), whereby a negative photoresist composition was obtained.

By using this negative photoresist composition, a resist pattern was formed on a silicon wafer in the same manner as in Example 1. The minimum line & space width of the resist pattern was 0.3 μm. However, even when the exposure energy was increased to 300 mJ/cm2, the line width was narrower than the space width, and the exposure energy which can resolve the line width and the space width of the resist to 1:1 was not able to be determined. The film-remaining ratio and the profile of the resist are as shown in Table 3.

COMPARATIVE EXAMPLE 2

The procedure of Example 1 was repeated except that a compound prepared by esterifying 2-naphthoquinonediazide-4-sulfonylchloride and 2,3,4-trihydroxybenzophenone in the molar ratio of 3:1 was used in place of the compound (1), whereby a negative photoresist composition was obtained.

By using this negative photoresist composition, it was tried to form a resist pattern on a silicon wafer in the same manner as in Example 1. However, even when the exposure energy was increased to 300 mJ/cm2, images ran and a perfect pattern was not able to be formed on the wafer.

COMPARATIVE EXAMPLE 3

The procedure of Example 1 was repeated except that poly(p-hydroxystyrene) having a weight-average molecular weight of 6,000 was used in place of the novolak resin used in Example 1, whereby a negative photoresist composition was obtained.

By using this negative photoresist composition, a resist pattern was formed on a silicon wafer in the same manner as in Example 1. The exposure energy required to resolve the line width and the space width of the resist to 1:1 was 75 mJ/cm2, which was in a practical range. However, when the profile of the resist was observed by an electron microscope, whisker-like raised portions were found on the laterals of the resist. The resist pattern was thus unsuitable for practical use.

TABLE 3

| Comparative Example | (A)/(B) | (A) + (B) / (C) | Line & Space Width (μm) | Exposure Energy (mJ/cm²) | Film-Remaining Ratio (%) | Resist Profile (b/a) |
| --- | --- | --- | --- | --- | --- | --- |
| 1 | 1/10 | 1/4 | 0.35 | *1 | 30 | *2 |
| 2 | 1/10 | 1/4 | — | *3 | — | — |
| 3 | 1/10 | 1/4 | 0.35 | 75 | 96 | *4 |

*1: Even at 300 mJ/cm² or more, the line & space width was not resolved to 1:1.
*2: Equilateral traingle.
*3: Even at 300 mJ/cm² or more, no image remained.
*4: Whisker-line raised portions were found on the laterals of resist.

What is claimed is:

1. A negative photoresist composition comprising:
(A) a compound represented by the following formula (I):

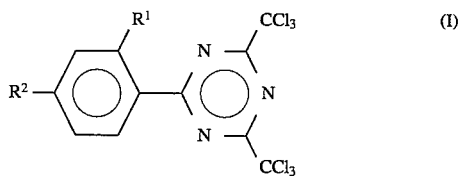

wherein R¹ and R², which are different from each other, represent a hydrogen atom or a group represented by the following formula (II):

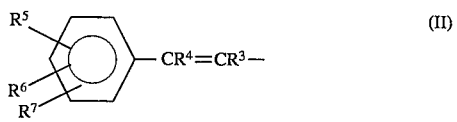

wherein R³ and R⁴, which may the same or different from one another, each independently represent a hydrogen atom or an alkyl group, and R⁵, R⁶ and R⁷, which may be the same or different from one another, individually represent a hydrogen atom, a halogen atom, a substituted or unsubstituted alkyl group in which one or more methylene groups contained in the alkyl chain may be substituted by an oxygen atom or a sulfur atom, a cycloalkyl group, an alkenyl group, an aryl group or an aryloxy group, or two alkyl groups represented by R⁵, R⁶ or R⁷ may form a 5- or 6-membered ring, (B) an alkoxymethylated melamine in a monomer ratio of at least 60%, and (C) a novolak resin wherein the composition is sensitive to i-line or g-line.

2. A negative photoresist composition according to claim 1, wherein the compound represented by the formula (I) is a compound in which R¹ or R² represents a group having the formula (II) wherein R³, R⁴, R⁵, R⁶ and R⁷ represent a hydrogen atom, or R³, R⁴, R⁵ and R⁶ represent a hydrogen atom and R⁷ represents a chlorine atom at the 2-position.

3. A negative photoresist composition according to claim 1, wherein the alkoxymethylated melamine is hexamethoxy methyl melamine.

4. A negative photoresist composition according to claim 1, wherein the novolak resin is a novolak resin obtained by condensation between m-cresol and an aldehyde.

5. A negative photoresist composition according to claim 1, wherein the novolak resin is a novolak resin obtained by condensation between a phenol mixture containing m-cresol and one or more phenols selected from the group consisting of p-cresol, 2,4-xylenol, 2,5-xylenol and 3,5-xylenol, and an aldehyde.

6. A negative photoresist composition according to claim 5, wherein the phenol mixture contains from 85% to 35% by weight of m-cresol, and from 15% to 65% by weight of one or more phenols selected from the group consisting of p-cresol, 2,4-xylenol, 2,5-xylenol and 3,5-xylenol.

7. A negative photoresist composition according to claim 1, wherein the novolak resin has a weight-average molecular weight, calculated in terms of polystyrene, of 2,000 to 100,000.

8. The negative photoresist composition claimed in claim 1, wherein the compound of formula (I) is present in an amount of ⅟30 to ⅓ by weight of melamine, and the total of said compound of formula (I) and said malamine is in an amount of ⅟20 to ½ by weight of said novolak resin.

9. The negative photoresist composition claimed in claim 1, wherein the monomer ratio of the alkoxymethylated melamine is at least 80%.

10. A negative photoresist composition sensitive to i-line or g-line, comprising:
(a) a compound represented by the following formula (I):

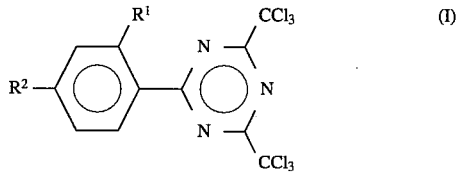

wherein R¹ and R², which are different from each other, represent a hydrogen atom of a group represented by the following formula (II):

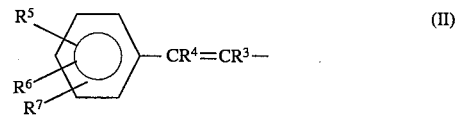

wherein R³, R⁴, R⁵, R⁶ and R⁷ represent a hydrogen atom, or R³, R⁴, R⁵ and R⁶ represent a hydrogen atom and R⁷ represents a chlorine atom at the 2-position, (b) an alkoxymethylated melamine wherein the number of carbon atoms of the alkoxyl group is from 1 to 4, in a monomer ratio of at least 60%, and (c) a novolak resin obtained by condensation between a phenol mixture containing from 85% to 35% by weight of m-cresol, and from 15% to 65% by weight of one or more phenols selected from the group consisting of p-cresol, 2,4-xylenol, 2,5-xylenol and 3,5-xylenol.

11. The negative photoresist composition claimed in claim 10, wherein the compound of formula (I) is present in an amount of ⅟30 to ⅓ by weight of melamine, and the total of said compound of formula (I) and said malamine is in an amount of ⅟20 to ½ by weight of said novolak resin.

12. The negative photoresist composition claimed in claim 10, wherein the monomer ratio of the alkoxymethylated melamine is at least 80%.

* * * * *